United States Patent
Rijssemus

(10) Patent No.: US 10,194,193 B2
(45) Date of Patent: Jan. 29, 2019

(54) CABLE NETWORK DEVICE HAVING INTERCONNECTED MICROSTRIP DIRECTIONAL COUPLERS

(71) Applicant: Technetix B.V., Veenendaal (NL)

(72) Inventor: Martien Rijssemus, Veenendaal (NL)

(73) Assignee: Technetix B.V., Veenendaal (NL)

( * ) Notice: Subject to any disclaimer, the term of this patent is extended or adjusted under 35 U.S.C. 154(b) by 0 days.

(21) Appl. No.: 15/444,593

(22) Filed: Feb. 28, 2017

(65) Prior Publication Data

US 2017/0264938 A1   Sep. 14, 2017

(30) Foreign Application Priority Data

Mar. 9, 2016   (GB) .................................. 1604054.5

(51) Int. Cl.
*H01P 3/08*   (2006.01)
*H01P 5/18*   (2006.01)
*H03H 7/48*   (2006.01)
*H04N 7/10*   (2006.01)
*H04N 21/426*   (2011.01)

(52) U.S. Cl.
CPC .......... *H04N 21/426* (2013.01); *H04N 7/104* (2013.01); *H01P 3/08* (2013.01); *H01P 5/184* (2013.01); *H03H 7/48* (2013.01)

(58) Field of Classification Search
None
See application file for complete search history.

(56) References Cited

U.S. PATENT DOCUMENTS 5,068,630 A * 11/1991 Gris ....................... H03H 7/461
                                                                    333/100

* cited by examiner

*Primary Examiner* — James R Marandi
(74) *Attorney, Agent, or Firm* — Wood Herron & Evans LLP

(57) ABSTRACT

There is provided a cable network device comprising an input associated with a plurality of outputs, wherein each output is connected to a respective microstrip directional coupler and each microstrip directional coupler is connected to at least one of the other microstrip directional couplers. The microstrip directional couplers form a series of microstrip directional couplers, with a last microstrip directional coupler in the series having its output port terminated by a resistive element. An isolated port of each microstrip directional coupler is in electrical communication with the upstream path.

7 Claims, 4 Drawing Sheets

CABLE NETWORK DEVICE HAVING INTERCONNECTED MICROSTRIP DIRECTIONAL COUPLERS

CROSS-REFERENCE TO RELATED APPLICATIONS

The present application claims priority under 35 U.S.C. § 119 of United Kingdom Patent Application No. 1604054.5, filed Mar. 9, 2016, the disclosure of which is hereby incorporated herein by reference in its entirety.

FIELD OF THE INVENTION

The present invention relates to a cable network device and, in particular, to a multiport amplifier.

BACKGROUND OF THE INVENTION

Cable networks need to transmit increasingly more data and programs and in order to achieve this the bandwidth of the networks needs to be stretched to accommodate transmission on higher frequencies. Higher frequencies produce higher losses, both in passive components like signal splitters and directional couplers, and also in coaxial cable conveying the signals.

Cable networks are required to be bi-directional with data transmitted from the network provider to the customer and data transmitted from the customer to the provider. This is achieved by using two specific frequency bands, one for upstream (data from customers) and one for downstream (data to customers). An example of these upstream and downstream bands are 5-65 MHz for upstream and 85 to 862 MHz for downstream. With the demand for more data, these upstream and downstream frequency bands will also stretch, e.g., 5-204 MHz for upstream and 258-1220 MHz or even 258-2000 MHz for downstream.

A typical cable installation at the customer premises comprises of a multiport amplifier with the input connected to the cable network and the outputs connected to different lengths of coaxial cable to feed different points in the house with cable TV signals. Different lengths of coaxial cable have different signal losses with the longest cable having the highest signal loss. The higher the frequency the higher the signal loss in the coaxial cable.

SUMMARY OF THE INVENTION

In accordance with the present invention, there is provided a cable network device suitable for use in broadband and cable television networks, the device comprising an input associated with a plurality of outputs, each output connected to one of a series of interconnected microstrip directional couplers, and configured with separate upstream and downstream paths, wherein an isolated port of each microstrip directional coupler is in electrical communication with the upstream path and the isolated port of alternate microstrip directional couplers in the series is connected to the isolated port of one adjacent microstrip directional coupler using at least one transformer. The microstrip directional couplers allow the gain and tilt for each output to compensate for different cable losses, such as occur when different lengths of coaxial cable are connected to the outputs to feed different points in a user's dwelling with cable TV signals.

The downstream path is for high frequency signals preferably in the range 258-2000 MHz from the network provider to a user and the upstream path is for low frequency signals preferably in the range 5 to 204 MHz from the user to the network provider. The device is thus preferably bi-directional, allowing electrical signals to pass from the network provider to the user and for signals to be sent from the user to the network provider.

Preferably, each connected pair of isolated ports is connected to the adjacent connected pair of isolated ports using at least one transformer.

Preferably, each microstrip directional coupler is connected to an adjacent microstrip directional coupler in the series by connecting an output port of the first microstrip directional coupler in the series to an input port of the next microstrip directional coupler in the series, with this connection repeated for all microstrip directional couplers in the series. This results in a plurality of microstrip directional couplers forming an interconnected cascade, with each microstrip directional coupler connected to a next microstrip directional coupler in the series, and each microstrip directional coupler associated with one output. Typically, the last microstrip directional coupler in the series will have its output port terminated by a resistive element.

Preferably, each output is connected to a coupled port of its respective microstrip directional coupler.

Preferably, a phase inverting transformer is disposed between the input and each microstrip directional coupler output port, such that all upstream signals pass through the phase-inverting transformer before reaching the input.

The cable network device is preferably an amplifier and more preferably a multiport amplifier.

BRIEF DESCRIPTION OF THE DRAWINGS

The present invention will now be described by way of example, and with reference to, the accompanying drawings in which.

DETAILED DESCRIPTION OF THE INVENTION

Broadband and data communication equipment connected to an in-home network has a limited downstream dynamic range and input signals need to be within a specific range. A signal with too low an amplitude means noise, too high an amplitude results in overload of the equipment. This can be overcome by careful design of a multiport amplifier which receives an input signal from a network provider at a headend and splits this into a plurality of customer output signals. The downstream gain from headend to user needs to be sufficient to overcome the signal losses of the in-home installation, but not much more. A good amplifier has a different gain for downstream signals on every output port to accommodate the different cable lengths between each output port and a connected user device, and so can accommodate different signal losses arising from different length cables. With existing amplifiers, the increase in loss for higher frequencies is usually disregarded as at present the highest frequency is 862 or 1006 MHz and the drop in signal level is tolerated. However, at higher frequencies, the drop becomes more significant and greatly affects signal quality.

The equipment connected to the in-home network receives downstream signals from the headend and also transmits data upstream to the headend in a lower upstream frequency range. The frequency of the upstream signal is very low compared to the downstream signal and is typically between 54 to 65 MHz and for this range of upstream frequencies the signal loss of the in-home installation is almost the same for all cable lengths. Therefore, the upstream gain of the amplifier should be almost the same for all output ports.

Figure 1:
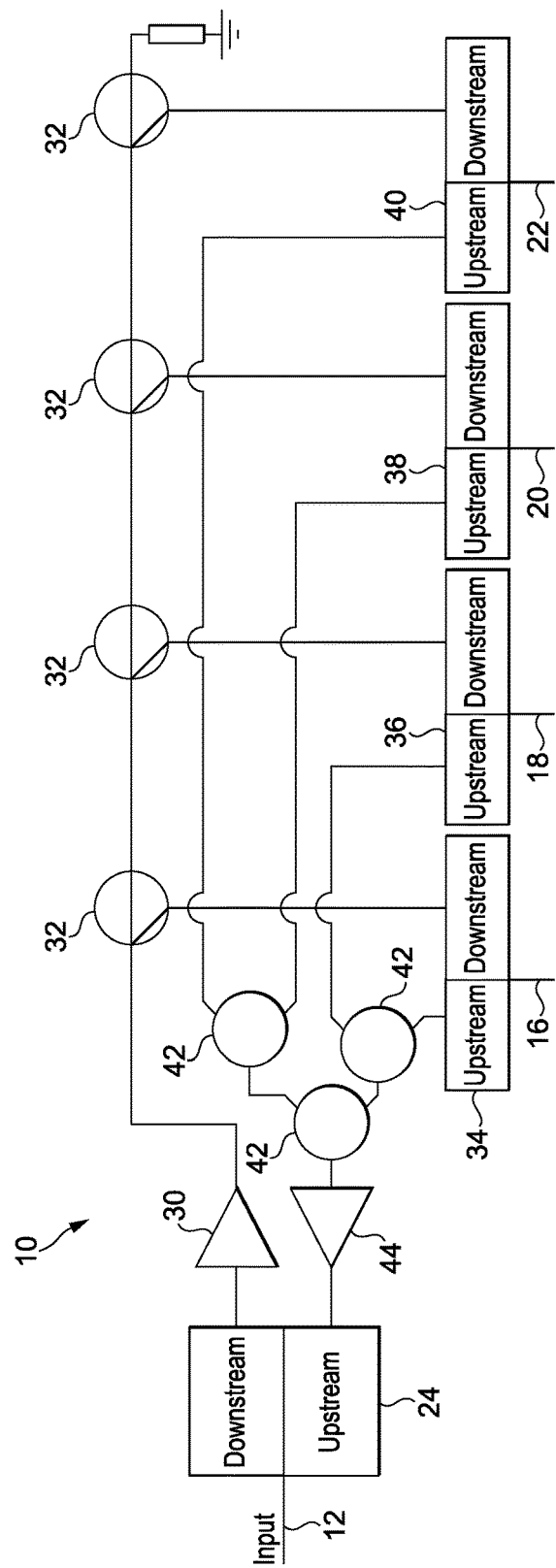
FIG. 1 is a schematic diagram of a prior art amplifier.

A diagram of typical good quality prior art four output amplifier 10 can be seen in FIG. 1. Input 12 in electrical communication with the headend is associated with a number of output ports 16, 18, 20 and 22, with diplexer 24 separating high frequency and low frequency signals into separate downstream and upstream paths. Ports 16, 18, 20 and 22 are connected to diplexers separating upstream and downstream frequencies. The downstream signal is amplified by downstream amplifier 30 and this signal is routed through a terminated cascade of ferrite directional couplers 32 in such a way that each output of a directional coupler has a different gain from input to its output. Thus, the downstream gain is varied for each port. The output of the directional coupler is connected to diplexer 34, 36, 38, 40 at the respective port 16, 18, 20, 22. The upstream frequencies are combined using two way ferrite signal splitters 42 and amplified by upstream amplifier 44. Upstream and downstream amplifier 44, 30 are both connected to diplexer 24 at input 12.

Figure 2:
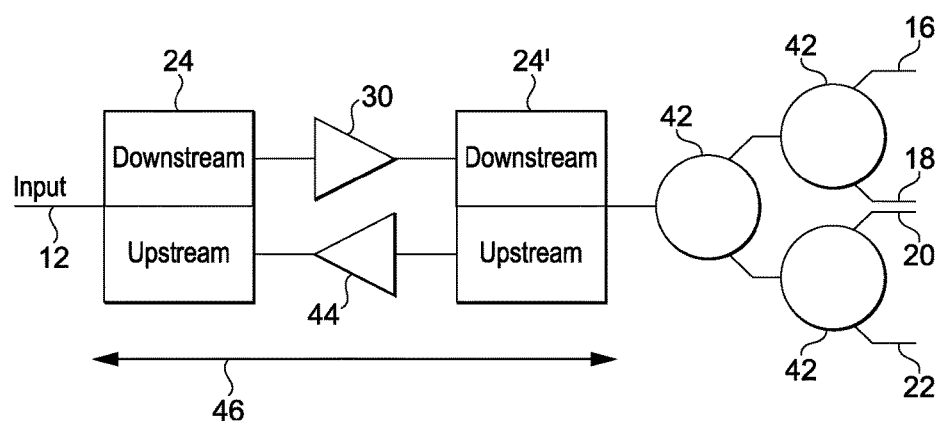
FIG. 2 is a schematic diagram of an alternative prior art amplifier.

Cheaper former art amplifiers, see FIG. 2, use a bi-directional amplifier 46 connected to a multiport ferrite signal splitter arrangement. The bi-directional amplifier 46 has a pair of diplex filters 24, 24' between which are disposed amplifier elements 30, 44 on the respective downstream and upstream paths. This arrangement has the disadvantage of having the same downstream gain at all output ports so this architecture does not accommodate for different cable lengths attached to the output ports at the customer end.

With the demand for higher frequencies in the upstream and downstream, both types of prior art amplifiers have disadvantages and limitations. In particular:

There is no compensation for the added signal losses at higher frequency for both types of prior art amplifiers as shown in FIGS. 1 and 2. This can lead to a too low signal at the highest frequency at the equipment resulting in a distorted signal and/or loss of data.

Because of the large number of ferrite directional couplers and signal splitters, a large portion of the cost price is caused by labour, especially alignment time. This increases exponentially when these couplers and signal splitter need to operate at higher frequencies.

Ferrite signal splitters and directional couplers have more signal loss at high frequency (>1000 MHz).

The architecture of the amplifier of FIG. 1 is quite complex and so expensive, with many diplex filters and ferrite loaded directional couplers and signal splitters. It is also an inflexible architecture. It is almost impossible to build this amplifier cost effective in such a way that diplexers can be changed by the customer when upstream and downstream frequencies change.

The architecture of the amplifier of FIG. 2 is simple but has the disadvantage of having the same gain for each output port.

Figure 3:
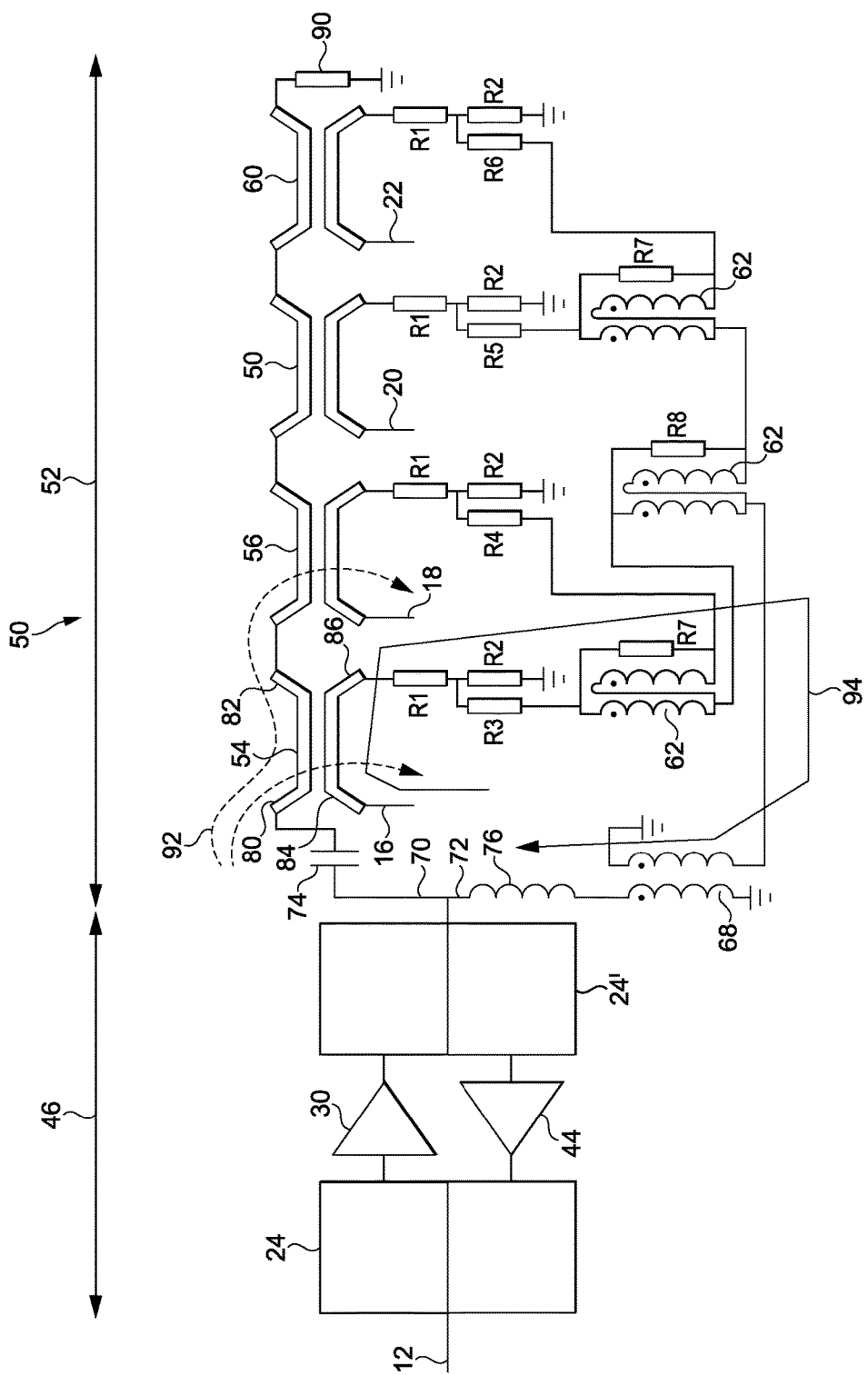
FIG. 3 is a schematic diagram of an amplifier in accordance with the present invention.

In order to address the aforementioned disadvantages, the present invention provides a multiport amplifier 50 as shown in FIG. 3 comprising of bi-directional amplifier 46 connected to a multiport combiner-divider 52. Amplifier 50 comprises a plurality of microstrip directional couplers 54, 56, 58, 60 in combination with combining transformers 62, 68 with the transformers 62 and 68 arranged in such a way that the signal path indicated as upstream route 94 is phase inverted.

Input 12 is connected to bi-directional amplifier 46 comprising two diplexers 24 and 24' and two amplifier elements 30, 44, one for upstream and one for downstream signals.

Between diplexer 24' and outputs 16, 18, 20, 22, the signal path is split into high frequency 70 and low frequency 76 branches by use of capacitor 74 and inductor 76. High frequency downstream signals will pass capacitor 74, low frequency upstream signals will pass inductor 76. Typical values for capacitor 74 are between 10 pF and 100 pF, and typical values for inductor 76 are between 20 nH and 400 nH, depending on the desired frequency characteristics of multiport amplifier 50.

A separate microstrip directional coupler is associated with each output as shown. Each microstrip directional coupler consists of an input port 80, an output port 82, a coupled port 84 and an isolated port 86. Each microstrip directional coupler is connected to the downstream or higher frequency path 70 using microstrip directional coupler input port 80 and is connected to one output of amplifier 50 by coupled port 84. The individual microstrip directional couplers associated with each output 16, 18, 20, 22 are connected together by connecting each microstrip directional coupler output port 82 to the adjacent microstrip directional coupler input port 80. In this way, a cascade of connected microstrip directional couplers is provided, with the last microstrip directional coupler 60 in this series being terminated by resistor 90. While amplifier 52 is shown with four outputs, or output ports, it may have any number of output ports.

Isolated port 86 of each microstrip directional coupler is in electrical communication with upstream signal path 72, connected to this upstream path using resistors and combining transformers 62, 68. In this way, downstream route 92, or higher frequency signal route, is provided along path 70, with the downstream signal reaching each output by way of individual microstrip directional couplers. Upstream route 94 is provided from each output through its respective microstrip directional coupler through resistors and associated combining transformers.

Capacitor 74 is connected to a cascade of microstrip directional couplers 54, 56, 58 60. Each microstrip directional coupler couples a part of the high frequency signal to the respective outputs 16, 18, 20, 22. Since the coupling of a microstrip directional coupler is frequency dependent, the frequency characteristic will be tilted with the highest signal level on the highest frequency. This counteracts the cable and network losses connected to the respective outputs 16, 18, 20, 22.

Microstrip directional couplers 54, 56, 58, 60 are arranged in such a way that output 16 has the highest gain and tilt and output 22 the lowest gain and tilt ensuring that different cable lengths can be accommodated and counteracted so that the result at the end of the line will be a flat frequency characteristic.

The coupling of a microstrip directional coupler at low frequencies is very low as it has a high attenuation. Low frequency upstream signals from outputs 16, 18, 20, 22 are therefore not influenced by the microstrip directional couplers. The low frequency upstream signals route through R1 and R2 and are combined at combining transformers 62 via resistors R3, R4, R5 and R6.

The values of the resistors R1 to R6 are chosen such that microstrip directional coupler 60 is terminated at the isolation port correctly (between 50 to 120 Ohm, depending on the design) and the attenuation of the upstream signals by the multiport hybrid combiner-divider is as required for the multiport amplifier 50. A typical value for R1 is 12 Ohm, a typical value for R2 is 100 Ohm, and typical values for R4, R5, R6 and R7 are 33 Ohm, 39 Ohm, 47 Ohm and 56 Ohm, respectively.

Combining transformer 62 has a turn ratio of 1:1 with resistors R7 and R8 acting as balancing resistors. The values of R7 and R8 are chosen for best isolation between output ports. A typical value for R7 is 240 Ohm, and a typical value for R8 is 120 Ohm. This arrangement ensures a very high output port to output port isolation both at low frequencies because of the combining transformers and high frequencies because of the microstrip directional couplers.

Transformer 68 is a phase inverting transformer and doubles as an impedance transformer with a typical turn ratio of 5:3.

FIG. 3 shows route 92 of the downstream signals to outputs 16 and 18 and the upstream route 94 for output 16. The equivalent paths apply to the other outputs.

Since the hybrid combiner-divider is a bi-directional structure, the choice of the upstream-downstream frequencies is set by diplexers 24 and 24' only. When the frequency range needs to be altered, diplex filters can be easily changed to upgrade the signal characteristics without the need to modify any of the other components. The value of capacitor 74 and inductor 76 is chosen so that the frequency response is a gradual curve.

If the upstream and downstream signals are such that the downstream signals are already at a low frequency, for example, 85 MHz, then these low frequency upstream signals follow upstream route 94 but of course in the other direction, so from inductor 76 to the respective output port.

Figure 4:
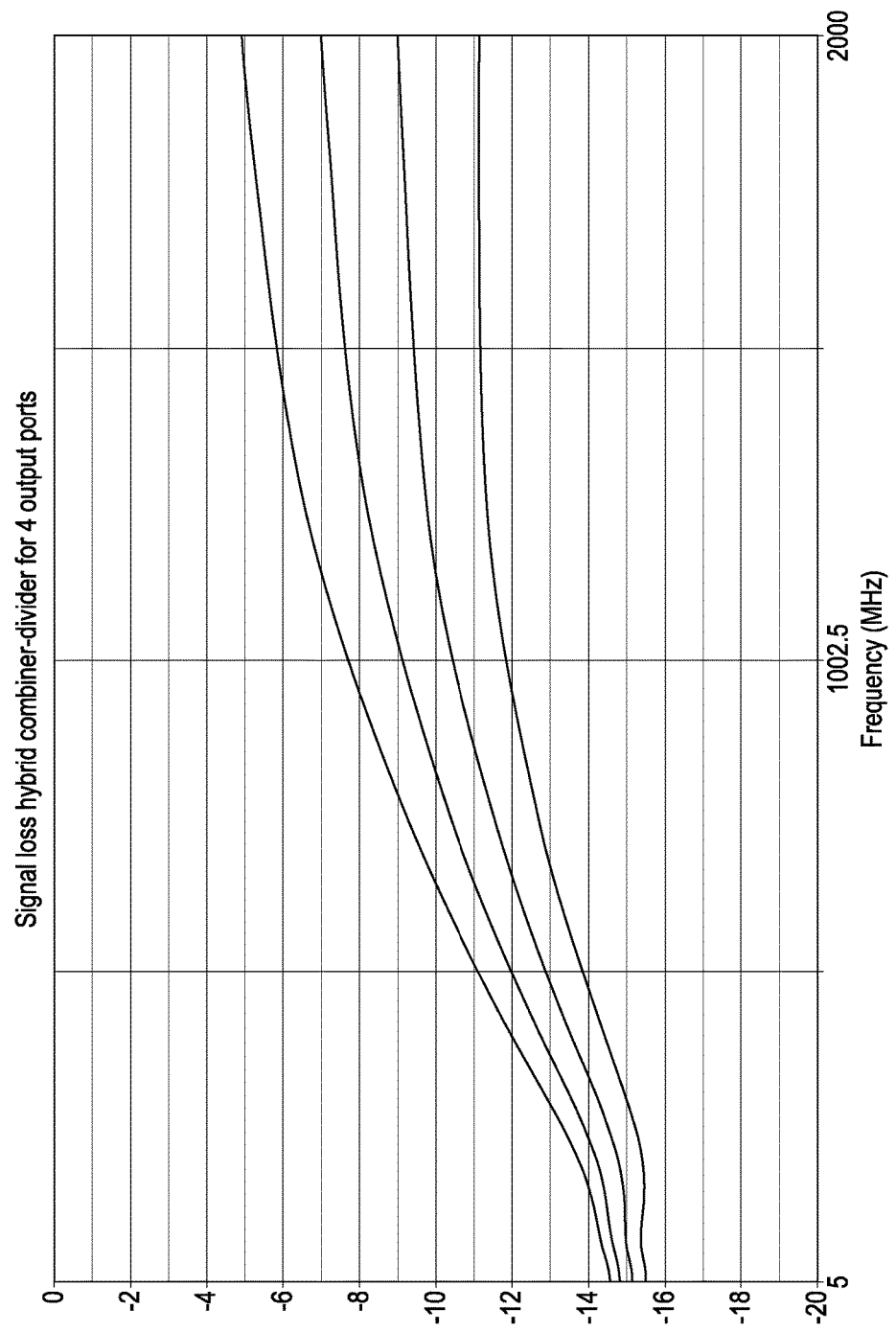
FIG. 4 is a graph showing expected performance for the amplifier of FIG. 3.

FIG. 4 shows a possible performance of a four output port amplifier optimised for RG59 cable lengths between 25 to 1 meter from 5 to 2000 MHz. For clarity reasons, it shows the performance of the hybrid combiner-divider only.

The multiport amplifier 50 has the following advantages:

Easy to produce for performance at very high frequencies, while former art multiport amplifiers struggle to meet performance up to 1220 MHz, the proposed architecture easily performs to 2000 MHz and above.

The multiport amplifier counteracts the cable and network losses.

Needs little or no alignment as combining transformers 62, 68 are used for low frequency only. This saves production costs.

Amplifier 50 can be produced with low tolerance on high frequency performance.

Amplifier 50 can be easily produced with replaceable diplexers 24 and 24' for best upstream-downstream flexibility.

Amplifier 50 has very high output port to output port isolation because of the use of a combination of combining transformers with microstrip directional couplers.

While the present invention has been illustrated by description of various embodiments and while those embodiments have been described in considerable detail, it is not the intention of Applicant to restrict or in any way limit the scope of the appended claims to such details. Additional advantages and modifications will readily appear to those skilled in the art. The present invention in its broader aspects is therefore not limited to the specific details and illustrative examples shown and described. Accordingly, departures may be made from such details without departing from the spirit or scope of Applicant's invention.

What is claimed is:

1. A cable network device, comprising:
   an input associated with a plurality of outputs, each output connected to one of a series of interconnected microstrip directional couplers, and configured with separate upstream and downstream paths;
   a first transformer located in the upstream path; and
   a second transformer,
   wherein an isolated port of each microstrip directional coupler is in electrical communication with the upstream path and the isolated port of alternate microstrip directional couplers in the series is connected to the isolated port of one adjacent microstrip directional coupler using the second transformer.

2. The cable network device according to claim 1, wherein each connected pair of isolated ports is connected to the adjacent connected pair of isolated ports using at least one transformer.

3. The cable network device according to claim 1, wherein each microstrip directional coupler in the series is connected to an adjacent microstrip directional coupler by connecting an output port of a first microstrip directional coupler in the series to an input port of the next microstrip directional coupler in the series.

4. The cable network device according to claim 3, wherein a last microstrip directional coupler in the series has its output port terminated by a resistive element.

5. The cable network device according to claim 4, wherein each output is connected to a coupled port of its respective microstrip directional coupler.

6. The cable network device according to claim 1, wherein a phase inverting transformer is disposed between the input and each microstrip directional coupler output port.

7. The cable network device according to claim 1 being an amplifier.

* * * * *